United States Patent
Lee

(10) Patent No.: US 10,109,792 B2
(45) Date of Patent: Oct. 23, 2018

(54) SWITCHING DEVICE AND RESISTIVE RANDOM ACCESS MEMORY INCLUDING THE SAME

(71) Applicant: SK hynix Inc., Icheon (KR)

(72) Inventor: Hyung Dong Lee, Hwaseong (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/156,966

(22) Filed: May 17, 2016

(65) Prior Publication Data

US 2017/0200888 A1 Jul. 13, 2017

(30) Foreign Application Priority Data

Jan. 8, 2016 (KR) .................. 10-2016-0002921

(51) Int. Cl.
*H01L 45/00* (2006.01)
*H01L 27/24* (2006.01)

(52) U.S. Cl.
CPC ...... *H01L 45/1233* (2013.01); *H01L 27/2409* (2013.01); *H01L 45/085* (2013.01); *H01L 45/1266* (2013.01); *H01L 45/145* (2013.01)

(58) Field of Classification Search
CPC . H01L 45/08; H01L 45/1266; H01L 45/1233; H01L 45/145; H01L 45/143
See application file for complete search history.

(56) References Cited

U.S. PATENT DOCUMENTS

| 8,058,643 B2 | 11/2011 | Meyer et al. | |
| 2011/0089391 A1* | 4/2011 | Mihnea | G11C 13/0007 257/2 |
| 2011/0095287 A1* | 4/2011 | Lee | G11C 11/5685 257/43 |
| 2012/0001143 A1* | 1/2012 | Strukov | B82Y 10/00 257/2 |
| 2015/0129829 A1* | 5/2015 | Kumar | H01L 27/2409 257/5 |

FOREIGN PATENT DOCUMENTS

KR 10-2015-0028871 A 3/2015

OTHER PUBLICATIONS

Prof. Saraswat, "Polycides, Salicides, and Metal Gates", EE311, Depart of EE, Stanfor University, Apr. 28, 2004 p. 1-27, http://web.stanford.edu/class/ee311/NOTES/Silicides%20&%20Metal%20gate%20Slides.pdf.*
KR 10-2015-0028871 machine translation.*

* cited by examiner

*Primary Examiner* — Brett Feeney
*Assistant Examiner* — Vincent Wall

(57) ABSTRACT

A switching device includes a first electrode and a second electrode, and an electrolyte layer disposed between the first electrode and the second electrode. The electrolyte layer includes a first layer charged with negative charges and a second layer charged with positive charges.

4 Claims, 12 Drawing Sheets

SWITCHING DEVICE AND RESISTIVE RANDOM ACCESS MEMORY INCLUDING THE SAME

CROSS-REFERENCE TO RELATED APPLICATION

The present application claims priority under 35 U.S.C 119(a) to Korean Patent Application No. 10-2016-0002921, filed on Jan. 8, 2016, which is herein incorporated by reference in its entirety.

BACKGROUND

1. Technical Field

Various embodiments of the present disclosure relate to a semiconductor memory and, more particularly, to a switching device and a resistive random access memory including the switching device.

2. Related Art

A cross-point memory array structure has been employed in a cell region of a memory device. More specifically, the cross-point memory array structure has been included in memories, such as a Resistive Random Access Memory (ReRAM), a Phase Change Random Access memory (PCRAM), a Magnetic Random Access Memory (MRAM) and so on, as a cell structure having a pillar, the pillar being interposed between electrodes disposed on different planes and intersecting with each other.

Meanwhile, in the cross-point memory array structure, there may be writing errors or reading errors on cell information due to a sneak current that occurs between adjacent cells. In order to suppress these errors, a selecting device has been employed in a cell. As the selecting devices, switching devices, such as transistors, diodes, tunnel barrier devices, and ovonic threshold switches, have been suggested.

SUMMARY

According to an embodiment, there is provided a switching device. The switching device includes a first electrode and a second electrode that are disposed over a substrate, and an electrolyte layer disposed between the first electrode and the second electrode. The electrolyte layer includes a first layer charged with negative charges and a second layer charged with positive charges.

According to an embodiment, there is provided a switching device. The switching device includes a first electrode, an electrolyte layer and a second electrode that are sequentially stacked over a substrate. The electrolyte layer includes a thin film charged with positive charges. The electrolyte layer accepts metal ions generated due to oxidation of the first electrode or the second electrode. The thin film acts an electrostatic repulsive force on the metal ions.

According to an embodiment, there is provided a resistive memory device. The resistive memory device includes a selection device and a variable resistance device that are disposed over a substrate. The selection device comprises a first electrode, an electrolyte layer and a second electrode that are sequentially disposed over the substrate. The electrolyte layer comprises a first layer charged with negative charges and a second layer charged with positive charges.

BRIEF DESCRIPTION OF THE DRAWINGS

Various embodiments of a present disclosure will become more apparent in view of the attached drawings and accompanying detailed description, in which.

DETAILED DESCRIPTION OF THE EMBODIMENTS

Figure 1:
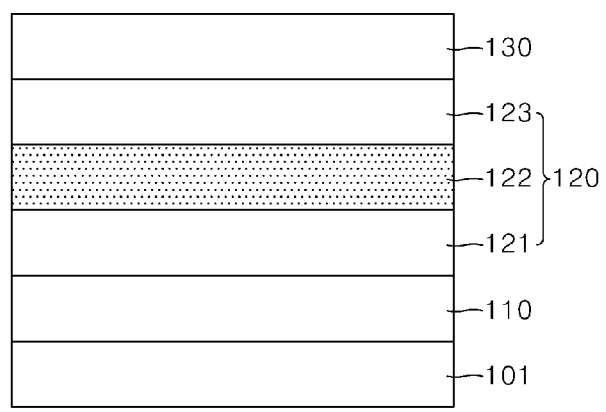
FIG. 1 is a cross-sectional view schematically illustrating a switching device according to an embodiment.

The present disclosure will be described hereinafter with reference to the accompanying drawings, in which embodiments of the invention are shown. In the drawings, the size, width, and/or thickness of components may be slightly increased in order to clearly express the components of each device. The drawings are described in the observer's point overall. If an element is referred to be located on another element, it may be understood that the element is directly located on the other element, or an additional element may be interposed between the element and the other element. The same reference numerals refer to the same elements throughout the specification.

In addition, expression of the singular form should be understood to include the plural forms unless clearly used otherwise in the context. It will be understood that the terms "comprise" or "have" are intended to specify the presence of a feature, a number, a step, an operation, an element, a part or combinations thereof, but not used to preclude the presence or possibility of addition one or more other features, numbers, steps, operations, components, parts or combinations thereof.

A threshold switching operation of a switching device described in this specification will be understood that the switching device sequentially implements a turn-on state and a turn-off state as described below, when an external voltage having a varying absolute value is applied to the switching device. At first, as an absolute value of the external voltage applied to the switching device is gradually increased from an initial state, an operational current of the switching device may be nonlinearly increased after the applied external voltage becomes greater than a predetermined first threshold voltage. This phenomenon can be understood such that the switching device is turned-on.

After that, as the absolute value of the external voltage applied to the switching device is gradually decreased from the turn-on state of the switching device, the operational current of the switching device may be nonlinearly decreased after the applied external voltage becomes lower than a predetermined second threshold voltage. This phenomenon can be understood such that the switching device is turned-off. As such, the switching device performing the threshold switching operation may have a nonlinear operational characteristic.

FIG. 1 is a cross-sectional view schematically illustrating a switching device 10 according to an embodiment.

Referring to FIG. 1, the switching device 10 includes a first electrode 110, an electrolyte layer 120, and a second electrode 130, which are sequentially disposed on a substrate 101. In an embodiment, the substrate 101 may be formed of silicon (Si) or gallium arsenic (GaAs), but embodiments are not limited thereto. In another embodiment, the substrate 101 may be formed of a ceramic, a polymer, or a metal, which can be processed by a semiconductor process. The substrate 101 may include integrated circuits formed therein.

Each of the first electrode 110 and the second electrode 130 may include any of a metal, a conductive metal nitride, a conductive metal oxide, and so on. One of the first electrode 110 and the second electrode 130 may include a material having stronger oxidizing power as compared to a material in the other. In an embodiment, when the first electrode 110 has stronger oxidizing power than the second electrode 130, the first electrode 110 may be formed of any of copper (Cu), silver (Ag), ruthenium (Ru), titanium (Ti), iridium (Ir), and a combination thereof, and the second electrode 130 may be formed of any of iridium (Ir), platinum (Pt), ruthenium (Ru), tungsten (W), titanium nitride (TiN), tantalum (TaN), and a combination thereof.

The electrolyte layer 120 may be disposed between the first electrode 110 and the second electrode 130. The electrolyte layer 120 may accept oxidized metal ions from one of the first electrode 110 and the second electrode 130 that has the stronger oxidizing power than the other. In an embodiment, the electrolyte layer 120 may include silicon, an oxide, or a nitride. In another embodiment, the electrolyte layer 120 may include a metal selenide layer, a metal sulfide layer, a silicon oxide layer, or a metal oxide layer. The electrolyte layer 120 may include a stack structure of two or more of the above materials. In an embodiment, the silicon oxide layer may have an amorphous structure that does not satisfy the stoichiometric ratio. In an embodiment, the metal oxide layer may include any of a copper oxide, a nickel oxide, a titanium oxide, a tin oxide, a cobalt oxide, a zinc oxide, an aluminum oxide, and so on, and may have a composition that does not satisfy the stoichiometric ratio.

The electrolyte layer 120 may include inner defects such as vacancies. In an embodiment, the vacancies may be metal vacancies, silicon vacancies, oxygen vacancies, nitrogen vacancies, or a combination thereof. Metal ions contained in the electrolyte layer 120 may be combined with electrons supplied from the vacancies, and thus may be converted to a metal. In addition, the converted metal may be re-oxidized in the electrolyte layer 120, and thus may be converted to metal ions. Through this process, metal vacancies may be generated in the electrolyte layer 120.

The electrolyte layer 120 may include at least a first layer charged with negative charges and a second layer charged with positive charges. The first layer may be doped with P-type dopants, and the second layer may be doped with N-type dopants. In an embodiment, the electrolyte layer 120 may have a structure that the first layer and the second layer are bonded to each other.

More specifically, referring to FIG. 1, the electrolyte layer 120 may include a first layer 121 charged with negative charges, a second layer 122 charged with positive charges, and a third layer 123 charged with negative charges, which are sequentially stacked on the first electrode 110. In an embodiment, the electrolyte layer 120 may be fabricated as follows.

The first layer 121 doped with P-type dopants, the second layer 122 doped with N-type dopants, and the third layer 123 doped with P-type dopants may be sequentially formed on the first electrode 110. When the sequentially stacked first to third layers 121-123 form P-N junctions, depletion layers of electrons and holes may be formed in a junction region between the first layer 121 and the second layer 122 and in a junction region between the second layer 122 and the third layer 123, respectively. The depletion layers of electrons or holes may be charged with positive charges or negative charges, respectively. Accordingly, an electric field may be formed between the depletion layers of electrons and holes.

Meanwhile, the sizes of the depletion layers of electrons and holes may be determined by concentrations of the dopants in the first to third layers 121-123. In an embodiment, the depletion layers of electrons and holes may be formed over the entire regions of the first to third layers 121-123 by controlling the doping concentrations of the first to third layers 121-123. Accordingly, the entire regions of the first to third layers 121-123 may be charged with the positive charges or the negative charges.

In an embodiment, the electrolyte layer 120 may be an amorphous silicon oxide layer. In an embodiment, the amorphous silicon oxide layer may be doped with N-type dopants by performing a doping process with atoms having a larger number of valence electrons than a silicon atom. The amorphous silicon oxide layer may be further doped with P-type dopants by performing a doping process with atoms having a smaller number of valence electrons than the silicon atom. As such, the first to third layers 121-123 may be fabricated by doping the amorphous silicon oxide layer constituting the electrolyte layer 120 with different dopant materials.

Meanwhile, in some other embodiments, unlike the above-described embodiments, only the second layer 122 may be doped with N-type dopants without doping the first layer 121 and the third layer 123. In this case, the second layer 122 may be charged with positive charges by a conduction of electrons from the second layer 122 charged with N-type dopants to the first layer 121 and the third layer 123. One of the first layer 121 and the third layer 123, which accepts the conducted electrons, may be charged with negative charges by the conduction of the electrons, or the first layer 121 and the third layer 123 may not be charged with any charges.

Meanwhile, in some other embodiments, at least one of the first to third layers 121-123 may be fabricated with a material different from materials of the other layers. For example, when the first layer 121 is an amorphous silicon oxide layer, at least one of the second layer 122 and the third layer 123 may be an electrolyte layer formed of a material that is different from a material of the amorphous silicon oxide layer.

Meanwhile, in some other embodiments, when forming the first to third layers 121-123, thin films including fixed space charges may be formed in predetermined positions in the electrolyte layer 120, respectively, instead of forming the N-type and P-type doped layers. In an embodiment, the first layer 121 having fixed negative charges, the second layer 122 having fixed positive charges, and the third layer 123 having fixed negative charges may be formed by controlling a thin film fabricating process.

Figure 2:
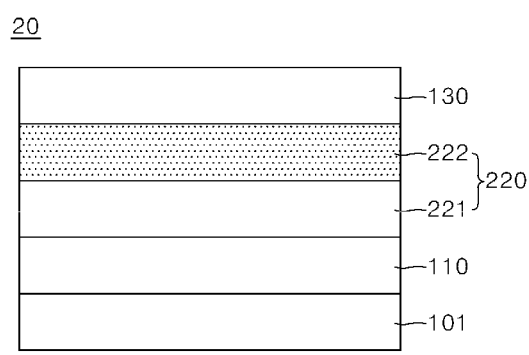
FIG. 2 is a cross-sectional view schematically illustrating a switching device according to another embodiment.

FIG. 2 is a cross-sectional view schematically illustrating a switching device 20 according to another embodiment.

Referring to FIG. 2, the switching device 20 includes a first electrode 110, an electrolyte layer 220, and a second electrode 130, which are sequentially disposed on a substrate 101. A structure of the switching device 20 is substantially the same as the structure of the switching device 10 described with reference to FIG. 1, except that the electrolyte layer 220 has a structure in which a first layer 221 charged with negative charges and a second layer 222 charged with positive charges are stacked.

In an embodiment, the first layer 221 may be a thin film doped with P-type dopants, and the second layer 222 may be a thin film doped with N-type dopants. In another embodiment, the first layer 221 may be a thin film doped with N-type dopants, and the second layer 222 may be a thin film doped with P-type dopants. An internal electric field may be formed in a junction region of the first layer 221 and the second layer 222. The internal electric field may be formed over the entire electrolyte layer 220 by controlling doping concentrations of the first layer 221 and the second layer 222.

Meanwhile, in some other embodiments, unlike the above-described embodiment, the second layer 222 may be doped with N-type dopants without doping the first layer 221 with any dopants. Alternatively, the first layer 221 may be doped with N-type dopants without doping the second layer 222 with any dopants. In either case, a conduction of electrons may occur from the thin film doped with the N-type dopants to the other un-doped thin film, thus, positive charges may be generated in the thin film doped with the N-type dopants. At this time, at least a portion of the un-doped thin film may be charged with negative charges by the conduction of electrons, or may not be charged with any charges.

Meanwhile, in some other embodiments, the first layer 221 and the second layer 222 may be formed of different materials. In an embodiment, when the first layer 221 is an amorphous silicon oxide layer, the second layer 222 may be an electrolyte layer formed of a material that is different from a material in the amorphous silicon oxide layer.

Meanwhile, in some other embodiments, when forming the first layer 221 and the second layer 222, thin films having fixed space charges may be formed at predetermined positions in the electrolyte layer 220, respectively, rather than the N-type and P-type doped layers.

FIGS. 3A, 4A, 5A, and 6A are schematic diagrams illustrating operations of a switching device according to an embodiment. FIGS. 3B, 4B, 5B, and 6B are schematic diagrams illustrating variations of energy bands of an electrolyte layer in the operations of the switching device according to an embodiment. FIG. 7 is a graph illustrating current-voltage (I-V) characteristics of the switching device according to an embodiment.

Hereinafter, the operations of the switching device will be described using the switching device 10 described above with reference to FIG. 1. In the switching device 10, the first electrode 110 has stronger oxidizing power than the second electrode 130. In an embodiment, the first electrode 110 may be formed of silver (Ag), and the second electrode 130 may be formed of platinum (Pt). The electrolyte layer 120 may be an amorphous silicon oxide layer. However, embodiments are not limited thereto.

Figure 3A:
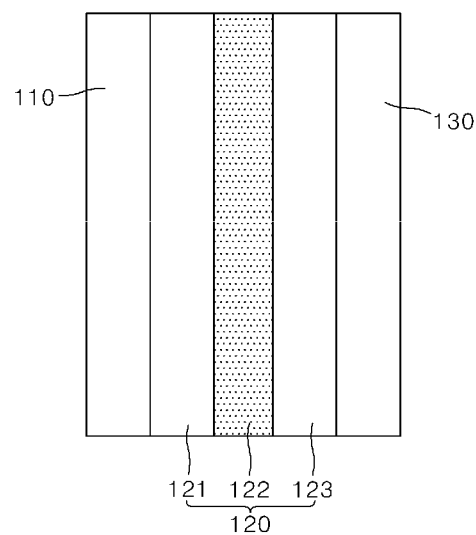
FIGS. 3A, 4A, 5A, and 6A are schematic diagrams illustrating operations of a switching device according to an embodiment.
Figure 3B:
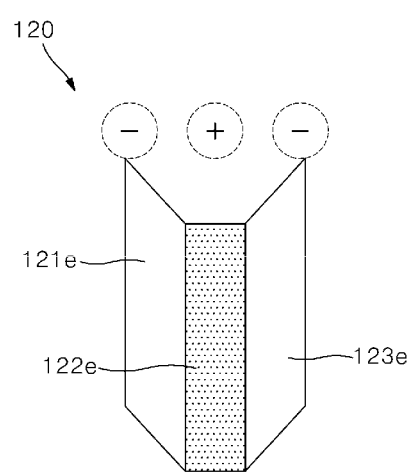
FIGS. 3B, 4B, 5B, and 6B are schematic diagrams illustrating variations of energy bands of an electrolyte layer during the operations of the switching device according to an embodiment.

FIGS. 3A and 3B illustrate an initial state of the switching device 10 when an external voltage is not applied yet between the first electrode 110 and the second electrode 130. FIG. 7 illustrates a current-voltage (I-V) characteristic when 0 V is applied between the first electrode 110 and the second electrode 130.

Referring to FIG. 3A, the electrolyte layer 120 includes the first layer 121 charged with negative charges, the second layer 122 charged with positive charges, and the third layer 123 charged with negative charges. Referring to FIG. 3B, energy bands 121e, 122e, and 123e may be bent over the first to third layers 121-123 due to an internal electric field caused by the positive and negative charges.

Figure 4A:
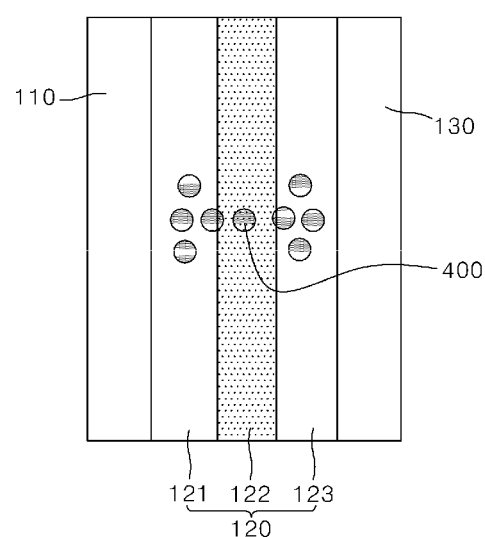
Figure 4B:
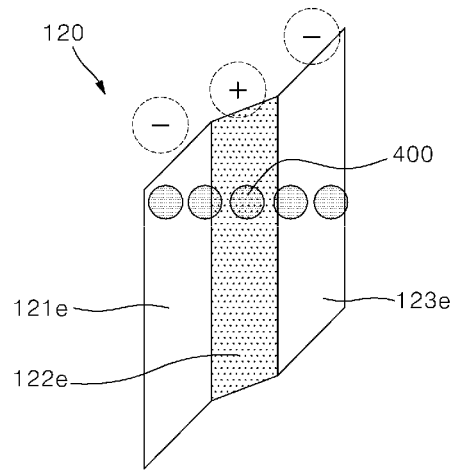

FIGS. 4A and 4B illustrate the switching device 10 when a positive bias is applied to the first electrode 110 and a negative bias is applied to the second electrode 130. Referring to FIG. 4B, in response to the applied external voltage, the energy bands 121e, 122e, and 123e of the first to third layers 121-123 may be deformed.

Meanwhile, the first electrode 110 may be oxidized due to the applied external voltage. Silver ions generated by the oxidation of the first electrode 110 may be moved into the electrolyte layer 120 that includes the silicon oxide layer. The silver ions may be arranged in the electrolyte layer 120 by an electric field formed between the first electrode 110 and the second electrode 130. The silver ions may be combined with electrons supplied from the vacancies of the silicon oxide layer, such that silver (Ag) metals 400 may be generated. The silver (Ag) metals 400 may be grown to have a filament shape by an electric field formed between the first electrode 110 and the second electrode 130. As the electric field generated by applying the external voltage between the first electrode 110 and the second electrode 130 increases and thus becomes greater than the internal electric field formed in the first to third layers 121-123, the silver (Ag) metals 400 may be grown from the first layer 121 to reach the third layer 123 across the second layer 122.

Referring to FIG. 7, as the external voltage is increased from 0 V to a first threshold voltage $V_{th1}$, a relatively low current flows in the switching device 10. When the external voltage reaches the first threshold voltage $V_{th1}$, the silver (Ag) metals 400 may forms a conductive bridge between the first electrode 110 to the third electrode 130, such that the first electrode 110 is electrically coupled to the third electrode 130 via the conductive bridge. This process is illustrated as a first process (1) in FIG. 7. As such, when the external voltage applied between the first and second electrodes 110 and 130 reaches the first threshold voltage $V_{th1}$, a rapidly increased first current $I_{c1}$ may flow in the switching device 10. When the first current $I_{c1}$ flows in the switching device 10 by the external voltage greater than or equal to the first threshold voltage $V_{th1}$, the switching device 10 may be referred to as being in a "turned-on" state. In FIG. 7, the measured current is confined to be less than or equal to the first current $I_{c1}$ that maintains the switching device 10 in the turned-on state.

Figure 5A:
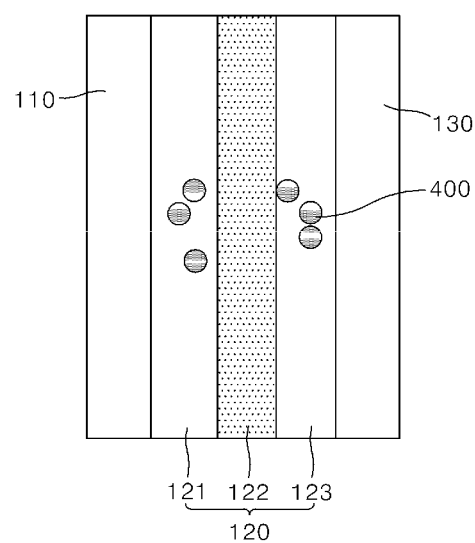
Figure 5B:
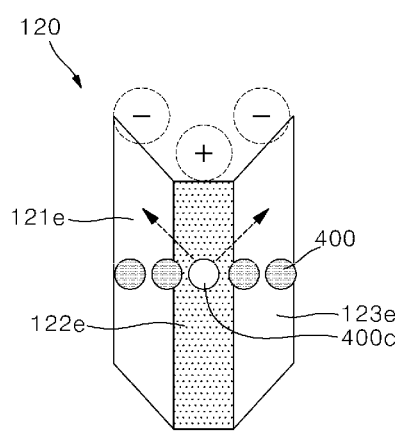

FIGS. 5A and 5B illustrate the switching device 10 when the external voltage applied between the first and second electrodes 110 and 130 is decreased from the first threshold voltage $V_{th1}$ at which the switching device 10 is in the turned-on state. Even in this case, a positive bias is applied to the first electrode 110, and a negative bias is applied to the second electrode 130.

When the external voltage applied between the first and second electrodes 110 and 130 is decreased to be below a second threshold voltage $V_{th2}$, the internal electric field formed in the first to third layers 121-123 may become stronger than the electric field formed by the external voltage. In an embodiment, some of the silver metals 400 constituting the conductive bridge may be re-oxidized to form the silver ions 400c in the electrolyte layer 120. An electrical repulsive force may act between the re-oxidized silver ions 400c and positive charges of the second layer 122. As a result, the silver ions 400c move outward from the second layer 122 due to the electrical repulsive force, and thus at least a portion of the conductive bridge in the second layer 122 may be disconnected. At this time, the switching device 10 may be referred to as being in a "turned-off" state. This process is illustrated as a second process (2) in FIG. 7.

Referring to FIG. 7, when the external voltage applied to the switching device 10 is decreased to be smaller than the second threshold voltage $V_{th2}$, the current flowing in the switching device 10 may be decreased from the first current $I_{c1}$ to 0 as the external voltage reaches 0 V.

Figure 6A:
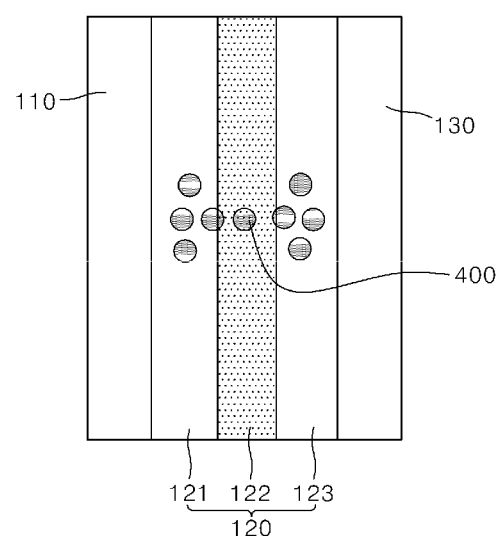
Figure 6B:
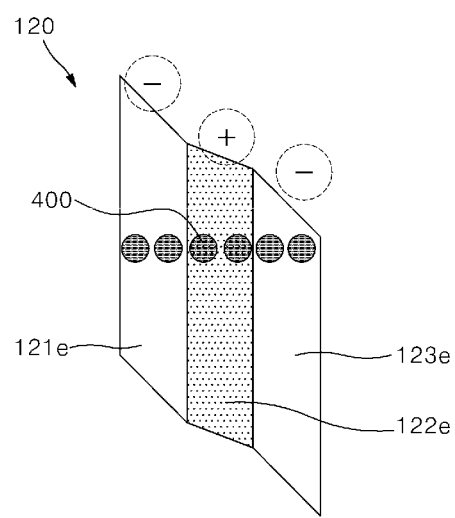
Figure 7:
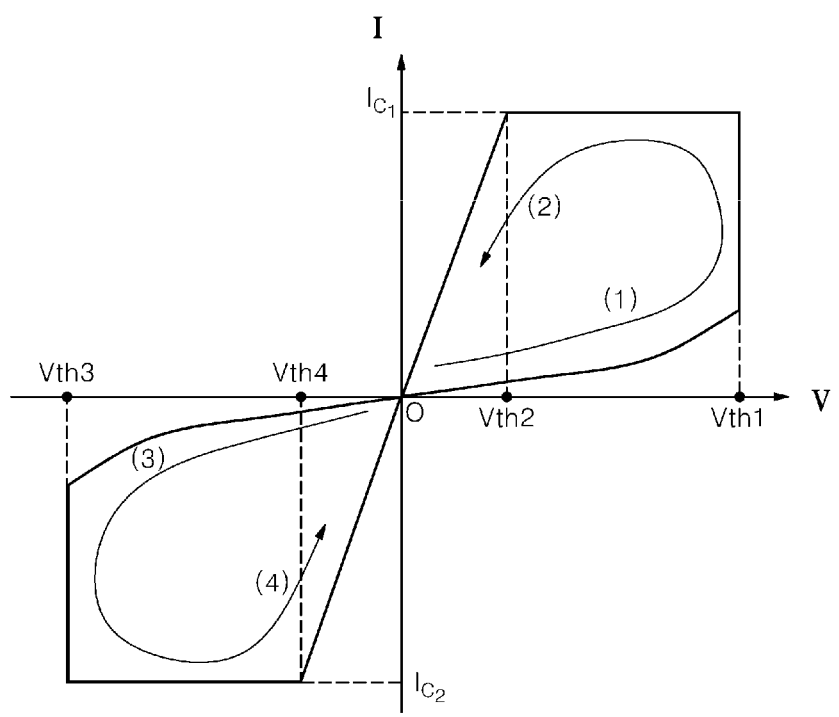
FIG. 7 is a graph illustrating current-voltage characteristics of a switching device according to an embodiment.

FIGS. 6A and 6B illustrate the switching device 10 when a negative bias is applied to the first electrode 110 and a positive bias is applied to the second electrode 130. As illustrated in FIG. 6B, in response to the applied external voltage, the energy bands 121e-123e of the first to third layers 121-123 may be deformed.

Referring to FIG. 6A, as the external voltage applied between the first electrode 110 and the second electrode 130 is increased in a negative direction, the silver ions 400c that moved outward from the second layer 122 may go back to the second layer 122 due to an electric field formed by the external voltage. The silver ions 400c may be converted into the silver metals 400 by accepting electrons provided by the vacancies in the second layer 122. The silver metals 400 converted in the second layer 122 may restore the conductive bridge. This process is illustrated as a third process (3) in FIG. 7.

Referring to FIG. 7, as an absolute value of the external voltage is increased from 0 V to a third threshold voltage $V_{th3}$ in a negative direction, a relatively low current flows in the switching device 10. The third threshold voltage $V_{th3}$ may have an absolute value corresponding to that of the first threshold voltage $V_{th1}$. When the external voltage reaches the third threshold voltage $V_{th3}$, a rapidly increased second current $I_{c2}$ may flow in the switching device 10. When the second current $I_{c2}$ flows in the switching device 10 at the external voltage having the absolute value that is greater than or equal to the absolute value of the third threshold voltage $V_{th3}$, the switching device 10 may be referred to as being in the "turned-on" state.

Referring to FIG. 7, when the absolute value of the external voltage applied between the first and second electrodes 110 and 130 is decreased to be smaller than an absolute value of a fourth threshold voltage $V_{th4}$ and reaches 0 V, the internal electric field formed in the first to third layers 121-123 may become stronger than the electric field formed by the external voltage, wherein the fourth threshold voltage $V_{th4}$ may have an absolute value corresponding to that of the second threshold voltage $V_{th2}$. In an embodiment, some of the silver metals 400 constituting the conductive bridge may be re-oxidized to form the silver ions 400c in the electrolyte layer 120. An electrical repulsive force may act between positive charges of the second layer 122 and the re-oxidized silver ions 400c. As a result, the silver ions 400c move outward the second layer 122 by the electrical repulsive force, and the conductive bridge in the second layer 122 may be disconnected again. This process is illustrated as a fourth process (4) in FIG. 7. At this time, the switching device 10 may be referred to as being in the "turned-off" state.

As described above, when the absolute value of the external voltage applied between the first and second electrodes 110 and 130 is increased to be greater than or equal to the absolute value of the first or third threshold voltage $V_{th1}$ or $V_{th3}$, the switching device represents a turned-on behavior by generation of the conductive bridge. On the other hand, when the absolute value of the external voltage applied between the first and second electrodes 110 and 130 is decreased to be smaller than the absolute value of the second or fourth threshold voltage $V_{th2}$ or $V_{th4}$ from the turned-on state, the switching device represents a turned-off behavior by disconnection of the conductive bridge. The current-voltage (I-V) switching characteristics represent that the switching device performs a threshold switching operation depending on the absolute value of the external voltage.

Also, as illustrated in FIG. 7, the switching device may show characteristics in which a current flowing in the switching device is non-linearly increased or decreased on the basis of the first or third threshold voltage $V_{th1}$ or $V_{th3}$. Accordingly, the switching devices according to embodiments of the present disclosure can implement more reliable on-off characteristics.

Figure 8:
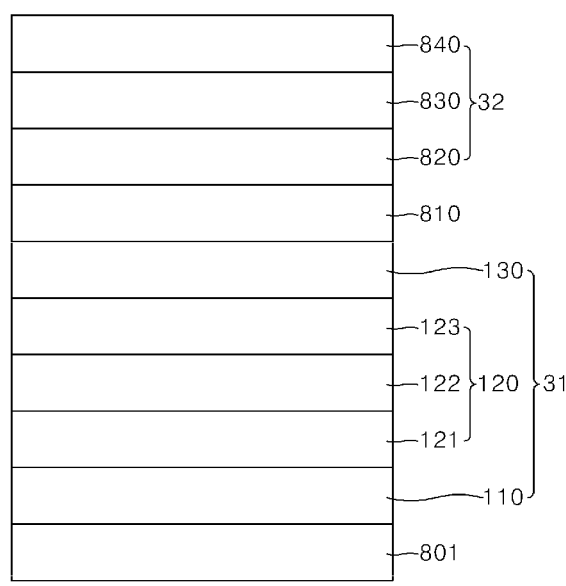
FIG. 8 is a cross-sectional view schematically illustrating a resistive memory device according to an embodiment.

FIG. 8 is a cross-sectional view schematically illustrating a resistive random access memory (hereinafter referred to as "resistive memory") device 30 according to an embodiment. In FIG. 8, the same reference numerals as in FIG. 1 may refer to the same elements as in FIG. 1.

Referring to FIG. 8, the resistive memory device 30 may include a selection device 31 and a variable resistance device 32, which are disposed on a substrate 801. The selection device 31 and the variable resistance device 32 may constitute a unit cell of the resistive memory device 30. The resistive memory device 30 may have an array structure including a plurality of unit cells.

The variable resistance device 32 may function as a nonvolatile memory element. The selection device 31 may be coupled to the variable resistance device 32, and can prevent generation of information errors between multiple numbers of unit cells of the resistive memory device 30 due to a sneak current.

The substrate 801 may be formed of any of silicon (Si), gallium arsenic (GaAs), and the like, but embodiments are not limited thereto. The substrate 801 may be formed of a material, which can be processed by a semiconductor process, such as a ceramic, a polymer, or a metal. The substrate 801 may include integrated circuits formed therein.

The selection device 31 may employ any of the above-described switching devices 10 and 20 according to embodiments. The selection device 31 may include a first electrode 110, an electrolyte layer 120, and a second electrode 130. In an embodiment, the electrolyte layer 120 may include an amorphous silicon, oxide, or nitride. In another embodiment, the electrolyte layer 120 may include a metal selenide layer, a metal sulfide layer, a silicon oxide layer, or a metal oxide layer. The electrolyte layer 120 may include a single layer or a stack structure of two or more of the above materials. The silicon oxide layer may have an amorphous phase that does not satisfy the stoichiometric ratio. The metal oxide layer may include any of a copper oxide, a nickel oxide, a titanium oxide, a tin oxide, a cobalt oxide, a zinc oxide, an aluminum oxide, and the like.

Referring to FIG. 8, the electrolyte layer 120 may include a first layer 121 charged with negative charges, a second layer 122 charged with positive charges, and a third layer 123 charged with negative charges, which are sequentially stacked. In an embodiment, the electrolyte layer 120 may be formed as follows. The first layer 121 doped with P-type dopants, the second layer 122 doped with N-type dopants, and the third layer 123 doped with P-type dopants may be sequentially formed on the first electrode 110. When the first layer 121, the second layer 122, and the third layer 123 form PN junctions therebetween, depletion layers of electrons and holes may be formed in the junction regions of the first layer 121, the second layer 122, and the third layer 123. Each of the depletion layers of electrons and holes may be charged with positive charges or negative charges. Accordingly, an electric field may be formed between the depletion layers of electrons and holes. In an embodiment, the depletion layers of electrons and holes may be formed over the entire regions of the first to third layers 121-123 by controlling doping concentrations of the first layer 121, the second layer 122, and the third layer 123. The entire area of the first to third layers 121-123 may be charged with positive charges or negative charges.

In some other embodiments, unlike the above-described embodiments, the second layer 122 may be doped with N-type dopants without doping the first layer 121 and the third layer 123 with any dopants. In this case, the second layer 122 may be charged with positive charges by a conduction of electrons from the second layer 122 doped with the N-type dopants to the first and third layers 121 and 123. At this time, at least a portion of the first and third layers 121 and 123 may be charged with negative charges by the conduction of electrons. Alternatively, any of the first layer 121 and the third layer 123 may not be charged with any charges.

Meanwhile, in some other embodiments, at least one of the first to third layers 121-123 may be formed of a material different from materials of the other layers. For example, when the first layer 121 is an amorphous silicon oxide layer, at least one of the second layer 122 and the third layer 123 may not be an amorphous silicon oxide layer but be a layer made of a material different from the above-described materials.

In some other embodiments, when forming the first to third layers 121-123, instead of forming the N-type and P-type doped layers separately, thin films including fixed space charges may be formed in predetermined positions of the electrolyte layer 120. In addition, in some other embodiments, unlike shown in FIG. 8, the electrolyte layer 120 may include only a first layer charged with negative charges and a second layer charged with positive charges, as shown in FIG. 2.

The selection device 31, as described above through the embodiments of the present disclosure, may show characteristics in which a current flowing in the selection device 31 is non-linearly increased or decreased based on a threshold voltage and an external voltage, and may show a threshold switching operation characteristic. One of the first electrode 110 and the second electrode 130 may have stronger oxidizing power than the other. In an embodiment, when the first electrode 110 has stronger oxidizing power than the second electrode 130, the first electrode 110 may include any of copper (Cu), silver (Ag), ruthenium (Ru), titanium (Ti), iridium (Ir), and a combination thereof. The second electrode 130 may include any of iridium (Ir), platinum (Pt), tungsten (W), titanium nitride (TiN), tantalum nitride (TaN), and a combination thereof.

A diffusion barrier layer 810 may be disposed between the selection device 31 and the variable resistance device 32. In an embodiment, the diffusion barrier layer 810 may be disposed on the second electrode 130 of the selection device 31. The diffusion barrier layer 810 may suppress diffusion of materials between the selection device 31 and the variable resistance device 32. In some other embodiments, when thermal or chemical stabilities of the materials constituting the selection device 31 and the variable resistance device 32 are secured, the diffusion barrier layer 810 may be omitted.

The variable resistance device 32 may be disposed on the diffusion barrier layer 810. The variable resistance device 32 may include a first memory electrode 820, a resistance change memory layer 830, and a second memory electrode 840. In an embodiment, the resistance change memory layer 830 may include a metal oxide such as a titanium oxide ($TiO_{2-x}$), an aluminum oxide ($Al_2O_3$), a nickel oxide ($NiO_x$), a copper oxide ($Cu_xO$), a zirconium oxide ($ZrO_2$), a manganese oxide ($MnO_2$), a hafnium oxide ($HfO_2$), a tungsten oxide ($WO_3$), a tantalum oxide ($Ta_2O_{5-x}$), a niobium oxide ($Nb_2O_5$), an iron oxide ($Fe_3O_4$), or the like. In another embodiment, the resistance change memory layer 830 may include a perovskite material such as PCMO ($Pr_{0.7}Ca_{0.3}MnO_3$), LCMO($La_{1-x}Ca_xMnO_3$), BSCFO ($Ba_{0.5}Sr_{0.5}Co_{0.8}Fe_{0.2}O_{3-\delta}$), YBCO($YBa_2Cu_3O_{7-x}$), (Ba,Sr)TiO$_3$(Cr,Nb-doped), SrZrO$_3$(Cr,V-doped), (La,Sr)MnO$_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, $YBa_2Cu_3O_7$, or the like. In still another embodiment, the resistance change memory layer 830 may include a material of a selenide series such as $Ge_xSe_{1-x}$(Ag,Cu,Te-doped), or a metal sulfide such as $Ag_2S$, $Cu_2S$, CdS, ZnS, or the like.

Each of the first memory electrode 820 and the second memory electrode 840 of the variable resistance device 32 may include a metal, a nitride, a conductive oxide, or the like. Each of the first memory electrode 820 and the second memory electrode 840 may include one selected from gold (Au), platinum (Pt), copper (Cu), silver (Ag), ruthenium (Ru), titanium (Ti), iridium (Ir), tungsten (W), a titanium nitride (TiN), a tantalum nitride (TaN), and a combination thereof.

In some embodiments, the diffusion barrier layer 810 and the first memory electrode 820 may be omitted, and instead, the second electrode 130 of the selection device 31 may function as the first memory electrode 820 of the variable resistance device 32.

As described above, according to an embodiment, a resistive memory device shows a voltage-current characteristic, in which an operating current is non-linearly increased or decreased based on a threshold voltage and an external voltage, and may include a selection device having a high on-off current ratio. The selection device may include an electrolyte layer including at least a thin film charged with positive charges, and may generate or break a conductive bridge according to the external voltage applied thereto. Accordingly, the selection device may implement a more reliable non-memory switching characteristic.

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:
1. A switching device, comprising:
a first electrode and a second electrode that are disposed over a substrate; and
an electrolyte layer disposed between the first electrode and the second electrode,
wherein the electrolyte layer comprises a first layer charged with negative charges, a second layer charged with positive charges, and a third layer charged with negative charges, the second layer being disposed between the first layer and the third layer,
wherein the electrolyte layer is configured to receive metal ions from one of the first electrode and the second electrode and form a conductive bridge including a metal reduced from the metal ions, in response to a first external voltage that is equal to or larger than a first predetermined threshold voltage, the conductive bridge electrically coupling the first electrode to the second electrode,
wherein the electrolyte layer is configured to disconnect the conductive bridge based on an electrical repulsive force between the conductive bridge and the second layer, in response to a second external voltage that is equal to or lower than a second predetermined threshold voltage, wherein the second predetermined threshold voltage is lower than the first predetermined threshold voltage, wherein the conductive bridge is formed in the first, second, and third layers, and wherein the electrolyte layer comprises one selected from amorphous silicon, a nitride, a metal selenide layer, a metal sulfide layer, a silicon oxide layer, and a metal oxide layer.

2. The switching device of claim 1,
wherein the first layer is doped with P-type dopants, the second layer is doped with N-type dopants, and the third layer is doped with P-type dopants, and wherein the first layer, the second layer, and third layer form junctions therebetween.

3. The switching device of claim 1, wherein the first electrode has stronger oxidizing power than the second electrode.

4. The switching device of claim 1, wherein the first electrode comprises at least one selected from copper (Cu), silver (Ag), ruthenium (Ru), titanium (Ti), and iridium (Ir).

* * * * *